US009012335B2

(12) United States Patent
Hiyoshi et al.

(10) Patent No.: US 9,012,335 B2
(45) Date of Patent: Apr. 21, 2015

(54) SILICON CARBIDE SEMICONDUCTOR DEVICE AND METHOD FOR MANUFACTURING THE SAME (75) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 268 days.

(21) Appl. No.: 13/520,702

(22) PCT Filed: Mar. 4, 2011

(86) PCT No.: PCT/JP2011/055093
§ 371 (c)(1),
(2), (4) Date: Jul. 5, 2012

(87) PCT Pub. No.: WO2011/111627
PCT Pub. Date: Sep. 15, 2011

(65) Prior Publication Data
US 2012/0286291 A1 Nov. 15, 2012

(30) Foreign Application Priority Data
Mar. 12, 2010 (JP) .................. 2010-055910

(51) Int. Cl.
H01L 21/31 (2006.01)
H01L 21/82 (2006.01)
(Continued)

(52) U.S. Cl.
CPC .......... *H01L 21/8213* (2013.01); *H01L 21/049* (2013.01); *H01L 29/045* (2013.01);
(Continued)

(58) Field of Classification Search
USPC .......................... 438/775, 787, 791
See application file for complete search history.

(56) References Cited

U.S. PATENT DOCUMENTS 6,482,704 B1 11/2002 Amano et al.
2002/0172774 A1 11/2002 Lipkin
(Continued)

FOREIGN PATENT DOCUMENTS

CN 101919032 A 12/2010
EP 1434272 A1 6/2004
(Continued)

OTHER PUBLICATIONS

Extended European Search Report issued in European Patent Application No. 11753286.1 dated Jun. 12, 2014.
(Continued)

Primary Examiner — Jae Lee
(74) Attorney, Agent, or Firm — Venable LLP; Steven J. Schwarz; F. Brock Riggs (57) ABSTRACT A silicon carbide semiconductor device having excellent electrical characteristics including channel mobility and a method for manufacturing the same are provided. The method for manufacturing a silicon carbide semiconductor device includes: an epitaxial layer forming step of preparing a semiconductor film of silicon carbide; a gate insulating film forming step of forming an oxide film on a surface of the semiconductor film; a nitrogen annealing step of performing heat treatment on the semiconductor film on which the oxide film is formed, in a nitrogen-containing atmosphere; and a post heat treatment step of performing, after the nitrogen annealing step, post heat treatment on the semiconductor film on which the oxide film is formed, in an atmosphere containing an inert gas. The heat treatment temperature in the post heat treatment step is higher than that in the nitrogen annealing step and lower than a melting point of the oxide film.

17 Claims, 7 Drawing Sheets (51) Int. Cl.
  *H01L 21/04* (2006.01)
  *H01L 29/51* (2006.01)
  *H01L 29/66* (2006.01)
  *H01L 29/78* (2006.01)
  *H01L 29/94* (2006.01)
  *H01L 29/04* (2006.01)
  *H01L 29/16* (2006.01)

(52) U.S. Cl.
  CPC ........... *H01L29/1608* (2013.01); *H01L 29/513* (2013.01); *H01L 29/518* (2013.01); *H01L 29/6606* (2013.01); *H01L 29/66068* (2013.01); *H01L 29/7802* (2013.01); *H01L 29/94* (2013.01)

(56) References Cited

U.S. PATENT DOCUMENTS

| | | | |
|---|---|---|---|
| 2003/0057432 A1* | 3/2003 | Gardner et al. | 257/100 |
| 2004/0242022 A1 | 12/2004 | Kosugi et al. | |
| 2006/0194423 A1* | 8/2006 | Lim et al. | 438/591 |
| 2007/0221977 A1* | 9/2007 | Tanaka | 257/302 |
| 2008/0135954 A1* | 6/2008 | Ohmi et al. | 257/411 |
| 2008/0203402 A1 | 8/2008 | Endo et al. | |
| 2011/0006310 A1 | 1/2011 | Nagasawa et al. | |
| 2011/0186862 A1 | 8/2011 | Harada et al. | |

FOREIGN PATENT DOCUMENTS

| | | |
|---|---|---|
| JP | 2003-086792 | 3/2003 |
| JP | 2008-147365 | 6/2008 |
| JP | 2008-244455 | 10/2008 |
| JP | 2009-158933 | 7/2009 |

OTHER PUBLICATIONS

Chung et al., "4H-SiC oxynitridation for generation of insulating layers," Journal of Physics: Condensed Matter, Institute of Physics Publishing, Bristol, GB, vol. 16, No. 17, May 5, 2004, pp. S1857-S1871, XP020059491.

Rozen et al., "Density of interface states, electron traps, and hole traps as a function of the nitrogen density in SiO2 on SiC," Journal of Applied Physics, American Institute of Physics, Melville, NY, vol. 105, No. 12, Jun. 22, 2009, pp. 124506-1 to 124506-11, XP012125765.

Inumiya et al., "Fabrication of high-mobility nitrided hafnium silicate gate dielectrics with Sub-1-nm equivalent oxide thickness using plasma nitridation and high-temperature postnitridation annealing," Japanese Journal of Applied Physics, Japan Society of Applied Physics, JP, vol. 45, No. 4B, Apr. 1, 2006, pp. 2898-2902, XP001518010.

Office Action issued in Chinese Patent Application No. 201180010027.3 dated Jul. 16, 2014.

* cited by examiner

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same, and more specifically to a silicon carbide semiconductor device exhibiting excellent electrical characteristics and a method for manufacturing the silicon carbide semiconductor device.

BACKGROUND ART

Research and development of semiconductor devices in which silicon carbide is used as a semiconductor material instead of silicon is now being actively performed. Among the silicon carbide semiconductor devices, MOSFET is of particular interest (see for example Japanese Patent Laying-Open No. 2009-158933 (hereinafter referred to as PTL 1)). PTL 1 discloses that an epitaxial film made of silicon carbide is formed on a surface of a silicon carbide substrate, and an oxide film is thereafter formed on a surface of the epitaxial film. After this, an annealing process is performed in a nitrogen-containing atmosphere, and another annealing process is further performed using argon gas as an atmosphere. According to PTL 1, such processes can be performed to reduce the interface state density in a boundary region between the epitaxial film and the oxide film and consequently increase the carrier mobility in the epitaxial film.

CITATION LIST

Patent Literature

PTL 1: Japanese Patent Laying-Open No. 2009-158933

SUMMARY OF INVENTION

Technical Problem

Regarding electrical characteristics such as carrier mobility in a semiconductor device which is formed using the method disclosed in PTL 1, however, it is considered that the electrical characteristics can further be enhanced, in view of the physical characteristics of silicon carbide. Further, in terms of enhancement of the performance of the semiconductor device, further improvements of the electrical characteristics of the silicon carbide semiconductor device are desired.

The present invention has been made to solve the above-described problem, and an object of the present invention is to provide a silicon carbide semiconductor device having excellent electrical characteristics such as channel mobility as well as a method for manufacturing the silicon carbide semiconductor device.

Solution to Problem

In order to lower the interface state density in the vicinity of the interface between a semiconductor film made of silicon carbide and an oxide film, the inventors of the present invention have conducted studies of various processes to complete the present invention. Specifically, as an approach to reduction of the interface state density in the vicinity of the interface between a semiconductor film made of silicon carbide and an oxide film, heat treatment in a nitrogen-containing atmosphere and subsequent post heat treatment in an inert gas may be performed as disclosed in PTL 1 to reduce the interface state density to some degree. The inventors have given further consideration to the conditions under which the post heat treatment is performed to newly find that the heat treatment temperature for the post heat treatment can be set higher than the heat treatment temperature in the nitrogen-containing atmosphere to thereby reduce the interface state density in the vicinity of the above-described interface. Based on the findings, a method for manufacturing a silicon carbide semiconductor device according to the present invention includes the steps of: preparing a semiconductor film made of silicon carbide; forming an oxide film on a surface of the semiconductor film; performing heat treatment on the semiconductor film on which the oxide film is formed, in an atmosphere containing nitrogen; and performing, after the step of performing heat treatment, post heat treatment on the semiconductor film on which the oxide film is formed, in an atmosphere containing an inert gas. A heat treatment temperature in the step of performing post heat treatment is higher than a heat treatment temperature in the step of performing heat treatment and lower than a melting point of the oxide film, and not lower than 1200° C. and not higher than 1400° C.

Further, a method for manufacturing a silicon carbide semiconductor device according to the present invention includes the steps of: preparing a semiconductor film made of silicon carbide; forming an insulating film on a surface of the semiconductor film; performing heat treatment on the semiconductor film on which the insulating film is formed, in an atmosphere containing nitrogen; and performing, after the step of performing heat treatment, post heat treatment on the semiconductor film on which the insulating film is formed. A heat treatment temperature in the step of performing post heat treatment is higher than a heat treatment temperature in the step of performing heat treatment and lower than a melting point of the insulating film, and not lower than 1200° C. and not higher than 1400° C.

Further, a method for manufacturing a silicon carbide semiconductor device according to the present invention includes the steps of: preparing a semiconductor film made of silicon carbide; forming an insulating film on a surface of the semiconductor film by a deposition method; and performing post heat treatment on the semiconductor film on which the insulating film is formed. A heat treatment temperature in the step of performing post heat treatment is higher than a process temperature in the step of forming an insulating film and lower than a melting point of the insulating film, and not lower than 1200° C. and not higher than 1400° C.

In this way, the interface state density in the interface between the semiconductor film and the oxide film (insulating film) can be reduced, relative to the case where the heat treatment temperature in the post heat treatment step is equal to or lower than the heat treatment temperature for the heat treatment in the atmosphere containing nitrogen (nitrogen-containing atmosphere). Consequently, the carrier channel mobility in the interface between the semiconductor film and the oxide film (the interface between the semiconductor film and the insulating film) can be enhanced, and accordingly a silicon carbide semiconductor device having excellent electrical characteristics can be obtained. While the technical reason why such an effect of the present invention can be obtained has not been clarified accurately, the effect is considered as being obtained by the mechanisms as follows. Of the nitrogen introduced in the interface between the semiconductor film and the oxide film (insulating film) by the heat treatment (first heat treatment) in the nitrogen-containing atmosphere, the nitrogen having unterminated dangling bonds may be re-activated by the post heat treatment (second heat treatment) so that termination of the dangling bonds is promoted. It is assumed that carbon (C) atoms that are present in the above-described interface are one of the origins of dangling bonds. Another possible mechanism is that the second heat treatment promotes diffusion of the carbon atoms.

The lower limit of the heat treatment temperature for the post heat treatment (second heat treatment) is set at the heat treatment temperature for the first heat treatment, in order to demonstrate that the second heat treatment that is performed at a temperature higher than the heat treatment temperature for the first heat treatment makes the interface state density lower than that achieved by the conventional method. The upper limit of the heat treatment temperature for the post heat treatment is set lower than the melting point of the oxide film (insulating film), in order to prevent the oxide film or insulating film from being melted by the post heat treatment. In the case for example where a silicon oxide film is used as an oxide film or insulating film, the melting point of the silicon oxide film ($SiO_2$) is approximately 1610° C. (1883K) (see the melting point of quartz glass ($SiO_2$) on p. 113 in "Vacuum Handbook, New Edition" edited by ULVAC, Inc., Ohmsha, Ltd., 2002). In order to ensure prevention of the silicon oxide film from being melted, the upper limit of the heat treatment temperature for the post heat treatment is preferably set for example at approximately 1500° C. (the softening point of $SiO_2$ is about 1500° C. (see the softening temperature of quartz glass ($SiO_2$) on p. 114 in "Vacuum Handbook, New Edition" edited by ULVAC, Inc., Ohmsha, Ltd., 2002)).

A silicon carbide semiconductor device according to the present invention is manufactured using the above-described method for manufacturing a silicon carbide semiconductor device. The silicon carbide semiconductor device thus obtained has a reduced interface state density in the vicinity of the interface between the semiconductor film and the oxide film or insulating film. Accordingly, in a silicon carbide semiconductor device in which the above-described oxide film or insulating film is used as a gate insulating film for example, the ratio of the channel resistance component to the device's ON resistance can be reduced. As a result, a silicon carbide semiconductor device of high breakdown voltage and low loss can be implemented.

Advantageous Effects of Invention

The present invention can provide a silicon carbide semiconductor device having a reduced interface state density and excellent electrical characteristics.

DESCRIPTION OF EMBODIMENTS

Embodiments of the present invention will hereinafter be described based on the drawings. In the following drawings, the same or corresponding components are denoted by the same reference numerals, and a description thereof will not be repeated.

First Embodiment

Figure 1:
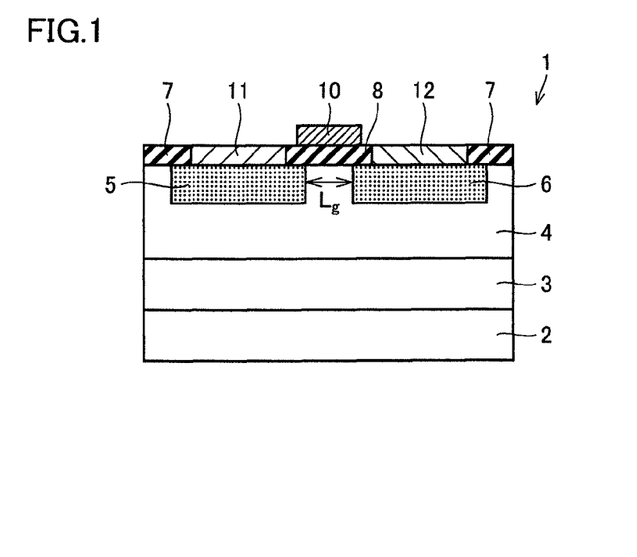
FIG. 1 is a schematic cross section showing a first embodiment of the semiconductor device according to the present invention.

Referring to FIG. 1, a first embodiment of the semiconductor device according to the present invention will be described.

A semiconductor device 1 shown in FIG. 1 is a lateral-type MOSFET (Metal-Oxide-Semiconductor Field-Effect Transistor) serving as a silicon carbide semiconductor device, and includes a substrate 2 made of silicon carbide (SiC), an epitaxial layer 3 made of silicon carbide and formed on this substrate 2, a p-type layer 4 made of silicon carbide and formed on this epitaxial layer 3, $n^+$ regions 5, 6 formed in a surface of p-type layer 4 so that they are spaced from each other, an oxide film 8 serving as a gate insulating film located on a channel region between these $n^+$ regions 5 and 6, a gate electrode 10 formed on this oxide film 8, and a source electrode 11 and a drain electrode 12 formed on $n^+$ regions 5 and 6, respectively. As substrate 2, a substrate made of SiC and having any plane orientation and any off angle may be used. For example, as substrate 2, a substrate whose main surface is a {03-38} plane having an off angle of approximately 53° relative to the plane orientation {0001} may be used. Substrate 2 contains an electrically conductive impurity of the n type.

Epitaxial layer 3 made of silicon carbide and formed on substrate 2 is an undoped layer. In p-type layer 4 formed on this epitaxial layer 3, a conductive impurity exhibiting the p type is contained. Further, in $n^+$ regions 5, 6, a conductive impurity exhibiting the n type is implanted. Oxide film 7, 8 is formed to cover these p-type layer 4 and $n^+$ regions 5, 6. In oxide film 7, 8, openings are formed in respective regions located on $n^+$ regions 5, 6. In the openings, source electrode 11 and drain electrode 12 that are electrically connected to $n^+$ regions 5 and 6 respectively are formed. On oxide film 8 which functions as a gate insulating film, gate electrode 10 is disposed. A channel length $L_g$ that is the distance between $n^+$ regions 5 and 6 may for example be approximately 100 μm. Further, the channel width may for example be approximately twice (approximately 200 μm) as large as the above-described channel length $L_g$.

For the semiconductor device shown in FIG. 1, the heat treatment temperature in a post heat treatment step performed after a nitrogen annealing process is set higher than the heat treatment temperature in the nitrogen annealing process as described later herein, to thereby sufficiently reduce the interface state density in the interface between p-type layer 4 serving as a semiconductor layer and oxide film 8. As an atmosphere containing nitrogen, a nitrogen oxide for example is used. Specifically, NO (nitrogen monoxide) gas or $N_2O$ (dinitrogen monoxide) gas is used as an atmosphere. As a result, the mobility (channel mobility) in the channel region (the region between $n^+$ regions 5 and 6 in p-type layer 4) having channel length $L_g$ can be made sufficiently large.

This result is considered as being obtained for the following reason. Specifically, in the case where oxide film 8 is formed by thermal oxidation or the like, many interface states are formed in the interface between oxide film 8 and p-type layer 4 which is a semiconductor layer. If this state remains unchanged, the channel mobility in the channel region is extremely lower than the theoretical value. In order to address this problem, in the interface region between this oxide film 8 and p-type layer 4, nitrogen atoms are introduced as described above by nitrogen annealing described later herein. Further, a post heat treatment step is performed to re-activate the nitrogen atoms introduced by the nitrogen annealing and promote termination of dangling bonds. Furthermore, from the interface, carbon atoms which may form dangling bonds are diffused by the post heat treatment to reduce the density of the carbon atoms in the interface. It is considered that the influence of the above-described interface states can accordingly be lessened to enhance the channel mobility. Here, instead of above-described oxide film 8 serving as a gate insulating film, any insulating film such as a nitride film like silicon nitride film or a silicon oxynitride film may be used.

Referring next to FIGS. 2 to 5, a description will be given of a manufacturing method in the first embodiment of the semiconductor device according to the present invention.

Figure 2:
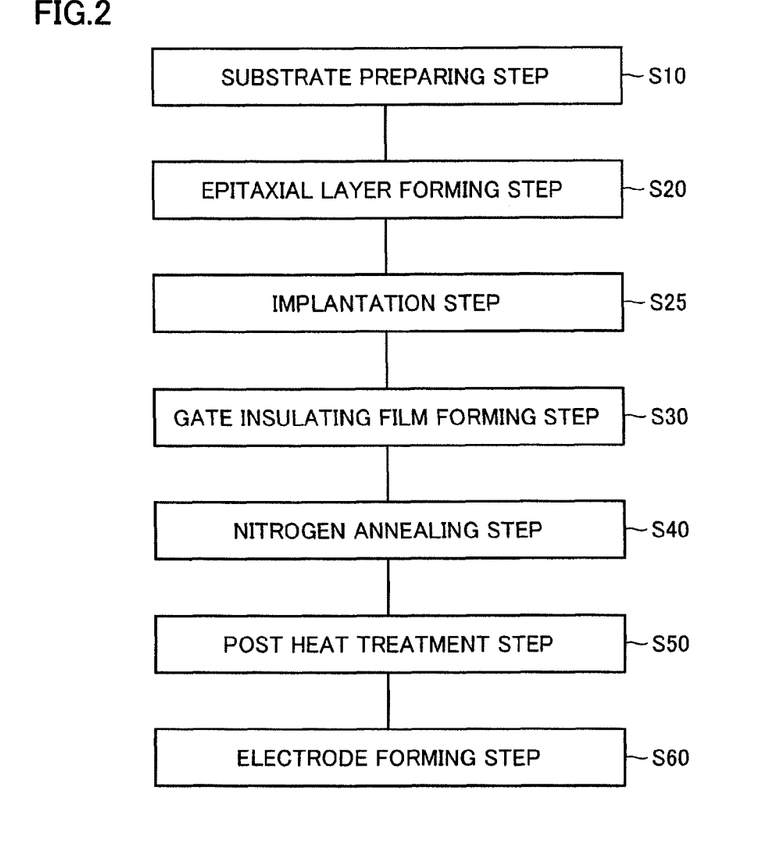
FIG. 2 is a flowchart for illustrating a method for manufacturing the semiconductor device shown in FIG. 1.

First, as shown in FIG. 2, a substrate preparing step (S10) is performed. In this step, an n-type substrate of 4H—SiC for example is prepared as substrate 2. As the plane orientation of a main surface of the substrate to be prepared, any plane orientation may be employed. For example, a substrate whose main surface is a plane inclined by a predetermined off angle (approximately 8° or less for example) relative to the (0001) plane may be used, or a silicon carbide substrate of the n-type conductivity whose main surface has the plane orientation of the {03-38} plane for example may be prepared as substrate 2. Such a substrate having a {03-38} plane as its main surface can be obtained for example by a method that cuts out a substrate from an ingot whose main surface is a (0001) plane so that a {03-38} plane is exposed as a main surface of the substrate.

Next, an epitaxial layer forming step (S20) is performed. Specifically, undope silicon carbide epitaxial layer 3 (see FIG. 1) is formed on substrate 2.

Next, an implantation step (S25) is performed. Specifically, a conductive impurity exhibiting the p-type conductivity (aluminum (Al) for example) is first implanted in epitaxial layer 3 to thereby form p-type layer 4 (see FIG. 1). Then, an impurity exhibiting the n-type conductivity is implanted to thereby form $n^+$ regions 5, 6 (see FIG. 1). As a conductive impurity exhibiting the n type, phosphor (P) may for example be used. When these $n^+$ regions 5, 6 are formed, any conventionally well-known method may be used. For example, after an oxide film is formed to cover the upper surface of p-type layer 4, photolithography and etching are performed to form, in this oxide film, openings that have the same two-dimensional shape pattern as the two-dimensional shape pattern of the regions where $n^+$ regions 5, 6 are to be formed. Further, the patterned oxide film is used as a mask to implant a conductive impurity. In this way, the above-described $n^+$ regions 5, 6 can be formed.

After this, activation annealing treatment is performed for activating the implanted impurity. For this activation annealing treatment, the conditions that the heating temperature is 1700° C. and the heating time is 30 minutes for example may be used.

Figure 4:
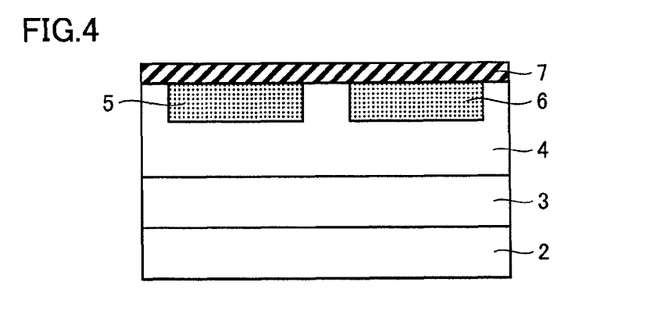
FIG. 4 is a schematic cross section for illustrating a step of the manufacturing method shown in FIG. 2.

Next, as shown in FIG. 2, a gate insulating film forming step (S30) is performed. Specifically, after the upper surface of p-type layer 4 and $n^+$ regions 5, 6 is sacrificially oxidized, oxide film 7 serving as a gate insulating film is formed as shown in FIG. 4. The thickness of oxide film 7 may for example be 40 nm. As a method for forming oxide film 7, thermal oxidation for example may be used. As the conditions for the thermal oxidation process, an oxidation temperature of not lower than 1100° C. and not higher than 1400° C. and an atmosphere such as an oxygen-containing atmosphere or a diluted oxygen atmosphere may be used for example. The time for which the thermal oxidation process is performed is determined as appropriate depending on the thickness of oxide film 7 to be formed. Before the gate insulating film forming step (S30) is performed, the upper surface of p-type layer 4 and $n^+$ regions 5, 6 may be cleaned (a pre-oxidation cleaning step may be performed). As a cleaning method used for this cleaning, any conventionally well-known cleaning method may be used.

Further, as the above-described gate insulating film, a silicon nitride film or a silicon oxynitride film may be formed instead of oxide film 7. As a method for forming the gate insulating film, any method other than the thermal oxidation method as described above may also be used. For example, a film (such as oxide film, nitride film, or oxynitride film) which is to serve as a gate insulating film may be formed using a deposition method such as CVD. Further, the gate insulating film formed by means of the deposition method may be subjected to annealing. As to the heating temperature for the annealing, preferably the heating temperature is set higher than the process temperature in the above-described step of depositing the film. Further, as an atmosphere for the annealing, an atmosphere containing an inert gas, or an atmosphere containing at least one selected from the group consisting of hydrogen ($H_2$), water ($H_2O$), phosphorus oxychloride ($POCl_3$), nitrogen monoxide (NO), and dinitrogen monoxide ($N_2O$) may be used.

Next, as shown in FIG. 2, a nitrogen annealing step (S40) is performed. Specifically, nitrogen monoxide (NO) gas or dinitrogen monoxide ($N_2O$) gas is used as an atmosphere gas and heat treatment is performed. As the conditions for this heat treatment, a heating temperature for example of not lower than 1100° C. and not higher than 1300° C. and heating time for example of approximately one hour may be used. Consequently, nitrogen atoms can be introduced in the interface region between oxide film 7, and p-type layer 4 and $n^+$ regions 5, 6. The nitrogen annealing step (S40) may be skipped and a post heat treatment step (S50) described below may be performed.

Next, as shown in FIG. 2, the post heat treatment step (S50) is performed. Specifically, an inert gas is used as an atmosphere gas and heat treatment is performed. As an atmosphere gas, any inert gas may be used. For example, argon (Ar) gas or nitrogen ($N_2$) gas may be used as an atmosphere gas. Further, as an atmosphere for the post heat treatment (S50), an atmosphere containing at least one selected from the group consisting of hydrogen ($H_2$), water ($H_2O$), phosphorus oxychloride ($POCl_3$), nitrogen monoxide (NO), and dinitrogen monoxide ($N_2O$) (a gas atmosphere of one of the above-listed elements diluted with an inert gas) may be used instead of the above-described inert gas atmosphere. This atmosphere gas has the effect of terminating dangling bonds in the interface between oxide film 7 and silicon carbide. Further, in the case where oxide film 7 or another insulating film is formed as a gate insulating film by means of the deposition method in the gate insulating film forming step (S30), the substrate on which the film to serve as a gate insulating film is formed may be disposed and subjected to heat treatment in an oxygen atmosphere, before the post heat treatment step (S50) is performed. This heat treatment oxidizes at least a part of silicon carbide located under the film to serve as a gate insulating film.

Figure 3:
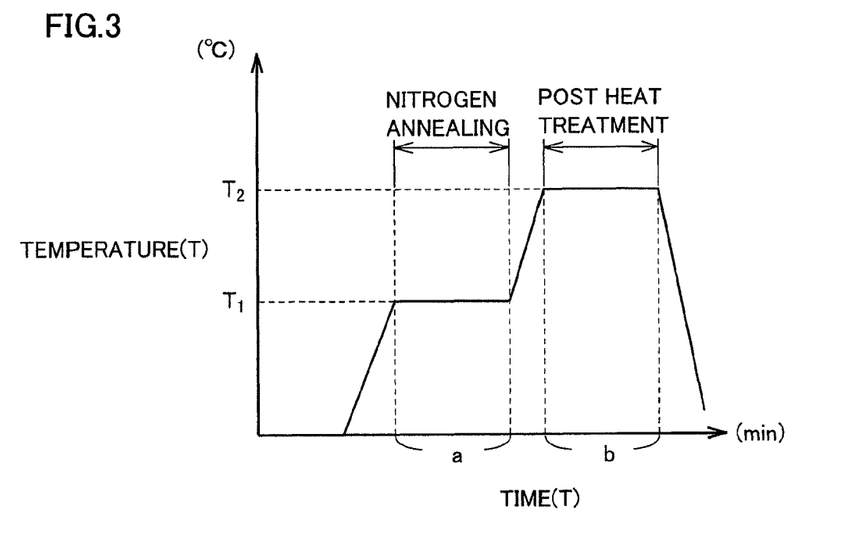
FIG. 3 is a graph showing a heat pattern in a nitrogen annealing step and a post heat treatment step in the method for manufacturing a semiconductor device shown in FIG. 2.

Here, the heat treatment temperature in the post heat treatment step (S50) is set higher than the heat treatment temperature in the nitrogen annealing step (S40) as shown in FIG. 3. In the graph shown in FIG. 3, the horizontal axis represents the process time (in minute), and the vertical axis represents the temperature (heat treatment temperature in ° C.). As shown in FIG. 3, according to the method for manufacturing a semiconductor device of the present invention, the heat treatment temperature (T2) in the post heat treatment step (heating time: b) is higher than the heat treatment temperature (T1) in the nitrogen annealing step (heating time: a). For example, in the case where the heat treatment temperature (T1) in the nitrogen annealing step is 1100° C., the heat treatment temperature (T2) in the post heat treatment step may be set at a temperature of higher than 1100° C. and not higher than 1500° C., more preferably a temperature of not lower than 1200° C. and not higher than 1400° C. Further, in the case where oxide film 7 or another insulating film is formed as a gate insulating film by means of the deposition method in the gate insulating film forming step (S30), it is preferable that the heat treatment temperature in the post heat treatment step (S50) is set higher than the process temperature for the above-described deposition method and lower than the melting point of the formed gate insulating film.

While the above-described steps (S30 to S50) may continuously be performed without interruption between the steps, these steps may also be performed discontinuously (an interval time period may be set between these steps). Further, a second insulating film may be formed to serve as an upper insulating film on above-described oxide film 7. For example, the deposition method may be used to form an oxide film or nitride film. For example, as the second insulating film, a film containing SiN, SiON, $HfO_2$, $ZrO_2$, $Ta_2O_5$, $La_2O_3$, silicate ($ZrAl_xO_y$), aluminate ($HfAl_xO_y$), $HfAlO_x$, $TiO_3$, $Al_2O_3$, AlON, AlN, or $Si_xN_y$ for example may be formed. Furthermore, on this second insulating film, a third insulating film such as oxide film or nitride film may also be formed. While these second and/or third insulating films may be formed in the step (S30), the second and/or third insulating films may be formed after the step (S40) or after the step (S50). Moreover, in the step (S30), an insulating film having a stacked structure may be formed instead of oxide film 7. For example, an ONO film in which an oxide film, a nitride film, and an oxide film are stacked in this order from the substrate side may be formed.

Figure 5:
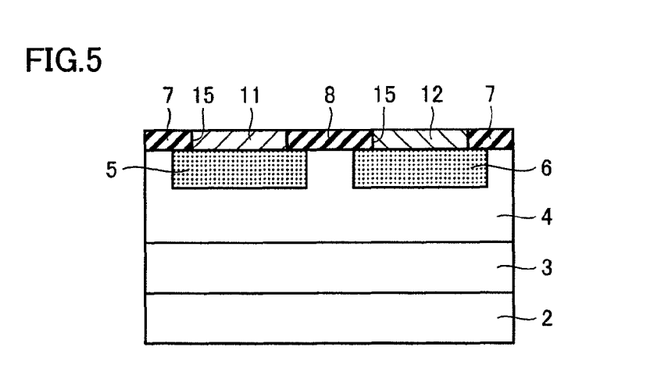
FIG. 5 is a schematic cross section for illustrating a step of the manufacturing method shown in FIG. 2.

Next, as shown in FIG. 2, an electrode forming step (S60) is performed. Specifically, the photolithography method is used to form a resist film having a pattern on oxide film 7. This resist film is used as a mask to partially remove oxide film 7 and thereby form openings 15 in respective regions located on $n^+$ regions 5, 6. In openings 15, a conductive film to serve as source electrode 11 and drain electrode 12 is formed as shown in FIG. 5. This conductive film is formed with the above-described resist film left as it is. After this, this resist film is removed, and the conductive film located on oxide film 7 can be removed (lifted off) together with the resist film to form source electrode 11 and drain electrode 12 as shown in FIG. 5. At this time, oxide film 8 (a part of oxide film 7 shown in FIG. 4) located between source electrode 11 and drain electrode 12 is the portion forming the gate insulating film of the semiconductor device to be formed.

After this, gate electrode 10 (see FIG. 1) is further formed on oxide film 8 serving as a gate insulating film. As a method for forming this gate electrode 10, the following method may be used. For example, a resist film having an opening pattern located in a region on oxide film 8 is formed in advance, and a conductive film which is to form the gate electrode is formed to cover the whole surface of the resist film. Then, the resist film is removed to thereby remove (lift off) the conductive film other than the portion of the conductive film to serve as a gate electrode. As a result, gate electrode 10 is formed as shown in FIG. 1. In this way, the semiconductor device as shown in FIG. 1 can be obtained.

Second Embodiment

Figure 6:
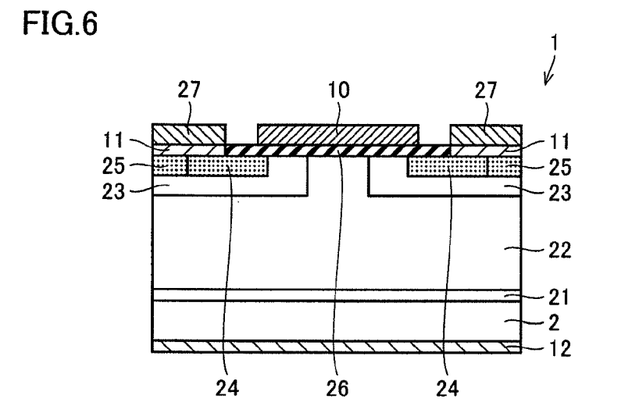
FIG. 6 is a schematic cross section showing a second embodiment of the semiconductor device according to the present invention.

Referring to FIG. 6, a second embodiment of the semiconductor device according to the present invention will be described.

With reference to FIG. 6, a semiconductor device 1 according to the present invention is a vertical-type DiMOSFET (Double Implanted MOSFET), and includes a substrate 2, a buffer layer 21, a breakdown voltage holding layer 22, a p region 23, an $n^+$ region 24, a $p^+$ region 25, an oxide film 26, a source electrode 11 and an upper source electrode 27, a gate electrode 10, and a drain electrode 12 formed on the back side of substrate 2. Specifically, on a front side of substrate 2 made of silicon carbide and having the n-type conductivity, buffer layer 21 made of silicon carbide is formed. This buffer layer 21 is of the n-type conductivity and has a thickness for example of 0.5 µm. Further, the concentration of an impurity of the n-type conductivity in the buffer layer may for example be $5×10^{17}$ $cm^{-3}$. On this buffer layer 21, breakdown voltage holding layer 22 is formed. This breakdown voltage holding layer 22 is made of silicon carbide and having the n-type conductivity, and has a thickness for example of 10 µm. Further, the concentration of an impurity of the n-type conductivity in breakdown voltage holding layer 22 may be $5×10^{15}$ $cm^{-3}$.

In a surface of breakdown voltage holding layer 22, p regions 23 having the p-type conductivity are formed so that they are spaced from each other. In p region 23, $n^+$ region 24 is formed in a surface layer of p region 23. At a position adjacent to this $n^+$ region 24, $p^+$ region 25 is formed. Oxide film 26 is formed to extend from above $n^+$ region 24 in one p region 23 to above the other p region 23 and $n^+$ region 24 in the other p region 23, through above the one p region 23 and the portion of breakdown voltage holding layer 22 that is exposed between these two p regions 23. On oxide film 26, gate electrode 10 is formed. On $n^+$ region 24 and $p^+$ region 25, source electrode 11 is formed. On source electrode 11, upper source electrode 27 is formed. On the back side of substrate 2 that is opposite to the front side on which buffer layer 21 is formed, drain electrode 12 is formed.

In an interface region between oxide film 26 and the semiconductor layers, namely $n^+$ region 24, $p^+$ region 25, p region 23 and breakdown voltage holding layer 22 (the region within 10 nm from the interface therebetween), nitrogen atoms are introduced by a nitrogen annealing step described layer herein, and a post heat treatment step is performed to promote termination of dangling bonds by nitrogen atoms, and also promote diffusion of carbon atoms to the outside of the interface region. Thus, the interface state density is sufficiently reduced. In this way, particularly the mobility in the channel region under oxide film 26 (the channel region is a part of p region 23 that is located between n$^+$ region 24 and breakdown voltage holding layer 22 and abuts on oxide film 26) can be improved as done in the semiconductor device shown in FIG. 1.

Next, referring to FIGS. 2, 7, and 8, a method for manufacturing the semiconductor device shown in FIG. 6 will be described.

First, similarly to the method for manufacturing a semiconductor device shown in FIG. 2, a substrate preparing step (S10) is performed. Here, a silicon carbide substrate of any plane orientation may be prepared as done by the method for manufacturing a semiconductor device in the first embodiment of the present invention, and substrate 2 (see FIG. 6) made of silicon carbide and has a {03-38} plane as its main surface is prepared for example as a substrate. As this substrate 2, a substrate having the n-type conductivity and a substrate resistance of 0.02 Ωcm may for example be used.

Next, an epitaxial layer forming step (S20) is performed. Specifically, on a surface of substrate 2, buffer layer 21 (see FIG. 6) is formed. As the buffer layer, an epitaxial layer made of silicon carbide and having the n-type conductivity and a thickness of 0.5 μm for example is formed. The concentration of the conductive impurity in buffer layer 21 may for example be $5 \times 10^{17}$ cm$^{-3}$. On this buffer layer 21, breakdown voltage holding layer 22 (see FIG. 6) is formed. As this breakdown voltage holding layer 22, a layer made of silicon carbide and having the n-type conductivity is formed by means of the epitaxial growth method. The thickness of breakdown voltage holding layer 22 may for example be 10 μm. Further, the concentration of the impurity of the n-type conductivity in this breakdown voltage holding layer 22 may for example be $5 \times 10^{15}$ cm$^{-3}$.

Next, an implantation step (S25) is performed similarly to the step shown in FIG. 2. Specifically, an oxide film formed by means of photolithography and etching is used as a mask to implant an impurity of the p-type conductivity in breakdown voltage holding layer 22 and thereby form p region 23 (see FIG. 6). Further, after the oxide film having been used is removed, an oxide film having a new pattern is formed again by means of photolithography and etching. This oxide film is used as a mask to implant an impurity of the n-type conductivity in a predetermined region and thereby form n$^+$ region 24 (see FIG. 6). Further, a similar method is used to implant a conductive impurity having the p-type conductivity and thereby form p$^+$ region 25 (see FIG. 6).

After this implantation step, activation annealing treatment is performed. For this activation annealing treatment, argon gas may be used as an atmosphere gas and the conditions that a heating temperature of 1700° C. and heating time of 30 minutes for example may be used.

Next, a gate insulating film forming step (S30) is performed similarly to the step shown in FIG. 2. Specifically, as shown in FIG. 7, oxide film 26 is formed to cover breakdown voltage holding layer 22, p region 23, n$^+$ region 24, and p$^+$ region 25. As a condition for forming this oxide film 26, dry oxidation (thermal oxidation) for example may be carried out. This dry oxidation may be performed under the conditions for example that the heating temperature is 1200° C. and the heating time is 30 minutes. Regarding both this second embodiment and the above-described first embodiment, the method for forming the oxide film in the gate insulating film forming step (S30) is not limited to thermal oxidation and any method (such as CVD) may also be used as described above.

After this, a nitrogen annealing step (S40) is performed similarly to the step shown in FIG. 2. Specifically, an atmosphere gas of nitrogen monoxide (NO) is used to perform annealing. As temperature conditions for the annealing, a heating temperature of 1100° C. and heating time of 120 minutes are used. As a result, in the vicinity of the interface between oxide film 26 and the underlying layer, namely breakdown voltage holding layer 22, p region 23, n$^+$ region 24, and p$^+$ region 25, nitrogen atoms are included.

After this, a post heat treatment step (S50) is performed similarly to the step shown in FIG. 2. Specifically, annealing is performed using an inert gas (argon (Ar) gas for example) as an atmosphere gas. For example, using argon gas as an atmosphere gas, conditions for example that a heating temperature of higher than 1100° C. and not higher than 1500° C., more preferably not lower than 1200° C. and not higher than 1400° C., and heating time of 60 minutes may be used. In this post heat treatment step (S50), the heat treatment temperature is set higher than the heat treatment temperature in the nitrogen annealing step (S40).

Next, an electrode forming step (S60) is performed similarly to the step shown in FIG. 2. Specifically, on oxide film 26, a patterned resist film is formed by means of the photolithography method. This resist film is used as a mask to remove the portion of the oxide film that is located on n$^+$ region 24 and p$^+$ region 25 by means of etching. After this, on the resist film and in the opening formed in oxide film 26, a film of a conductive material such as metal is formed so that the film contacts n$^+$ region 24 and p$^+$ region 25. After this, the resist film is removed to thereby remove (lift off) the conductive film located on the resist film. Here, nickel (Ni) for example may be used as a conductive material. As a result, as shown in FIG. 6, source electrode 11 and drain electrode 12 can be obtained. Here, it is preferable to perform heat treatment for alloying purpose. Specifically, heat treatment (alloying heat treatment) is performed using argon (Ar) gas which is an inert gas as an atmosphere gas, at a heating temperature of 950° C. for heating time of two minutes.

After this, upper source electrode 27 (see FIG. 6) is formed on source electrode 11. Further, on the back side of substrate 2, drain electrode 12 (see FIG. 8) is formed. In this way, the semiconductor device shown in FIG. 6 can be obtained.

Figure 9:
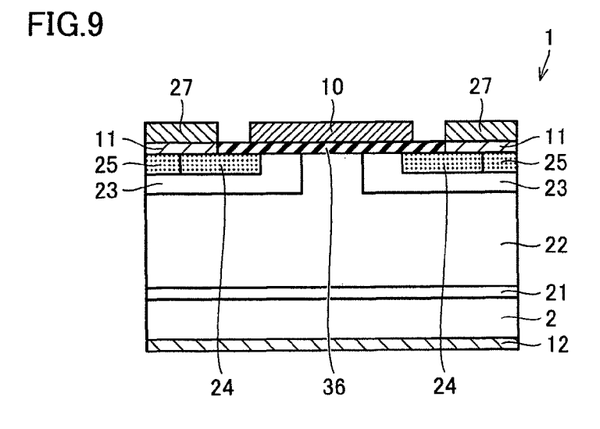
FIG. 9 is a schematic cross section showing a first modification of the second embodiment of the semiconductor device shown in FIG. 6.
Figure 10:
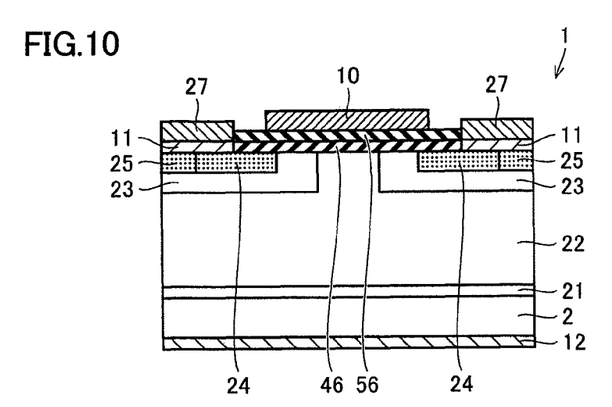
FIG. 10 is a schematic cross section showing a second modification of the second embodiment of the semiconductor device shown in FIG. 6.
Figure 11:
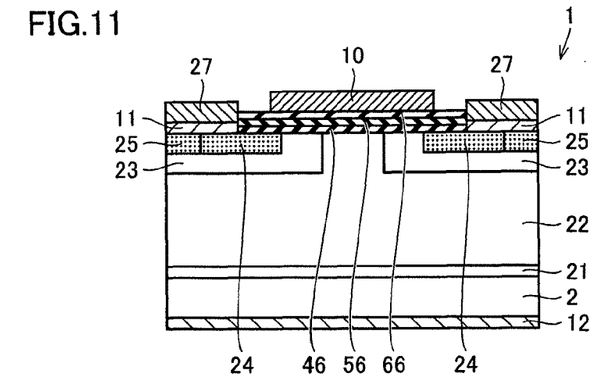
FIG. 11 is a schematic cross section showing a third modification of the second embodiment of the semiconductor device shown in FIG. 6.

Referring next to FIGS. 9 to 11, modifications of the semiconductor device shown in FIG. 6 will be described.

Referring to FIG. 9, a first modification of the second embodiment of the semiconductor device according to the present invention is basically configured similarly to the semiconductor device shown in FIG. 6. The first modification, however, has a gate insulating film configured differently from the semiconductor device shown in FIG. 6. Namely, in the semiconductor device shown in FIG. 9, the gate insulating film is not an insulating film formed by thermal oxidation, but an insulating film 36 formed by means of a deposition method such as CVD. As insulating film 36 formed by the deposition method, an oxide film (silicon oxide film for example), a nitride film (silicon nitride film for example), or an oxynitride film (silicon oxynitride film for example) may be used. While FIG. 9 shows that the film thickness of source electrode 11 is substantially equal to the thickness of insulating film 36, the film thickness of source electrode 11 may be larger than the thickness of insulating film 36 or smaller than that of insulating film 36. This configuration also enables similar effects to those of the semiconductor device shown in FIG. 6 to be obtained.

Figure 7:
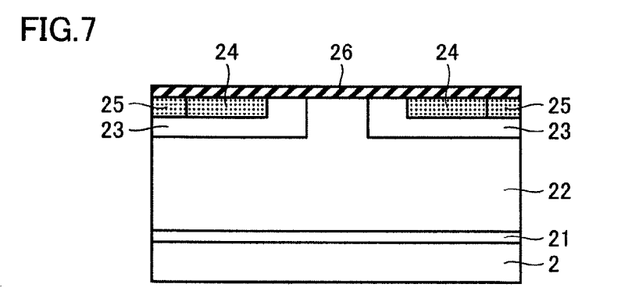
FIG. 7 is a schematic cross section for illustrating a method for manufacturing the semiconductor device shown in FIG. 6.
Figure 8:
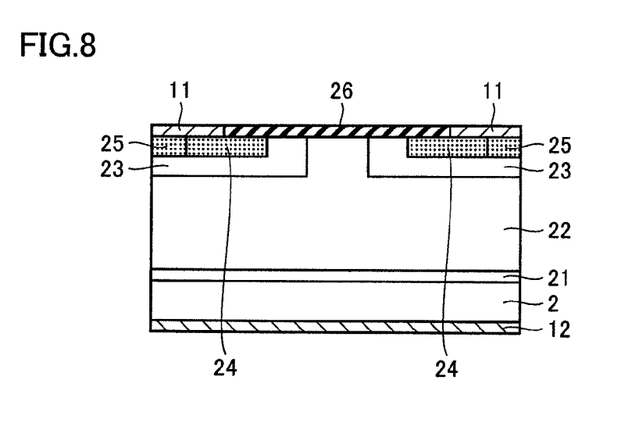
FIG. 8 is a schematic cross section for illustrating the method for manufacturing the semiconductor device shown in FIG. 6.

Further, while a method for manufacturing the semiconductor device shown in FIG. 9 is basically similar to the method for manufacturing the semiconductor device shown in FIG. 6, these methods are different from each other in the method for forming a film in the gate insulating film forming step (S30) shown in FIG. 7. Namely, after the steps (S10 to S25) in FIG. 2 are performed similarly to the method for manufacturing the semiconductor device shown in FIG. 6, the deposition method is used to form insulating film 36 in the gate insulating film forming step (S30). After this, the steps (S40 to S60) in FIG. 2 can be performed to thereby obtain the semiconductor device shown in FIG. 9.

A semiconductor device shown in FIG. 10 is a second modification of the second embodiment of the semiconductor device according to the present invention, and basically configured similarly to the semiconductor device shown in FIG. 6. The semiconductor device shown in FIG. 10, however, has a gate insulating film configured differently from the semiconductor device shown in FIG. 6. Namely, in the semiconductor device shown in FIG. 10, the gate insulating film has a stacked structure. Specifically, the gate insulating film in the semiconductor device shown in FIG. 10 is made up of a first insulating film 46, and a second insulating film 56 formed on the first insulating film 46.

As first insulating film 46, any insulating film may be used such as an oxide film formed by thermal oxidation, or an oxide film or a nitride film formed by the deposition method, for example, like oxide film 26 in the semiconductor device shown in FIG. 6. Further, while any insulating film may be used as second insulating film 56, it is preferable to use, as second insulating film 56, an insulating film formed by means of the deposition method. For example, as second insulating film 56, preferably an oxide film (silicon oxide film for example), a nitride film (silicon nitride film for example), or an oxynitride film (silicon oxynitride film for example) formed by the deposition method is used. In FIG. 10, the film thickness of source electrode 11 is substantially equal to the thickness of first insulating film 46. The thickness of source electrode 11, however, may be larger than the thickness of first insulating film 46 or smaller than the thickness of first insulating film 46. This configuration also enables similar effects to those of the semiconductor device shown in FIG. 6 to be obtained.

Further, a method for manufacturing the semiconductor device shown in FIG. 10 is basically similar to the method for manufacturing the semiconductor device shown in FIG. 6, except for the details in the gate insulating film forming step (S30) shown in FIG. 7. Namely, after the steps (S10 to S25) in FIG. 2 are performed similarly to the method for manufacturing the semiconductor device shown in FIG. 6, the gate insulating film forming step (S30) is performed in which first insulating film 46 is formed and thereafter second insulating film 56 is formed on first insulating film 46. As a method for forming first insulating film 46, any method may be used such as thermal oxidation or deposition method. As a method for forming second insulating film 56, the deposition method for example may be used. After this, the steps (S40 to S60) in FIG. 2 can be performed to thereby obtain the semiconductor device shown in FIG. 10.

A semiconductor device shown in FIG. 11 is a third modification of the second embodiment of the semiconductor device according to the present invention, and basically configured similarly to the semiconductor device shown in FIG. 6. The semiconductor device shown in FIG. 11, however, has a gate insulating film configured differently from the semiconductor device shown in FIG. 6. Namely, in the semiconductor device shown in FIG. 11, the gate insulating film has a stacked structure made up of three layers. Specifically, the gate insulating film in the semiconductor device shown in FIG. 11 is constituted of a first insulating film 46, a second insulating film 56 formed on first insulating film 46, and a third insulating film 66 formed on second insulating film 56.

As first insulating film 46, any insulating film such as an oxide film formed by thermal oxidation, or an oxide film or a nitride film formed by the deposition method may be used, like oxide film 26 in the semiconductor device shown in FIG. 6. While any insulating film may be used as second insulating film 56, an insulating film formed by means of the deposition method is preferably used. For example, it is preferable to use, as second insulating film 56, an oxide film (silicon oxide film for example), a nitride film (silicon nitride film for example), or an oxynitride film (silicon oxynitride film for example) formed by means of the deposition method. It is more preferable to use, as second insulating film 56, an insulating film (such as silicon nitride film) other than the silicon oxide film. As third insulating film 66, an insulating film formed by the deposition method may be used. For example, it is preferable to use, as third insulating film 66, an oxide film (silicon oxide film for example) formed by the deposition method. While FIG. 11 discloses the gate insulating film of the triple layer structure, an insulating film having a stacked structure made up of four or more layers may also be used as a gate insulating film. Further, while FIG. 11 shows that the film thickness of source electrode 11 is smaller than the total thickness of first insulating film 46 and second insulating film 56 and larger than the thickness of first insulating film 46, the film thickness of source electrode 11 may be equal to or smaller than the thickness of first insulating film 46, or larger than the total thickness of first insulating film 46 and second insulating film 56. This configuration also enables the effects similar to those of the semiconductor device shown in FIG. 6 to be obtained.

Further, while a method for manufacturing the semiconductor device shown in FIG. 11 is basically similar to the method for manufacturing the semiconductor device shown in FIG. 6, these methods are different from each other in details of the gate insulating film forming step (S30) shown in FIG. 7. Namely, after the steps (S10 to S25) in FIG. 2 are performed similarly to the method for manufacturing the semiconductor device shown in FIG. 6, a gate insulating film forming step (S30) is performed in which first insulating film 46 is formed, a second insulating film 56 is then formed on first insulating film 46, and third insulating film 66 is further formed on second insulating film 56. As a method for forming first insulating film 46, any method may be used such as thermal oxidation or deposition method. As a method for forming second insulating film 56, the deposition method for example may be used. As a method for forming third insulating film 66, the thermal oxidation or deposition method may be used for example. After this, the steps (S40 to S60) in FIG. 2 can be performed to obtain the semiconductor device shown in FIG. 11.

The configurations of the gate insulating film in semiconductor device 1 shown in FIGS. 9 to 11 as described above are applicable to semiconductor device 1 shown in FIG. 1. Specifically, instead of oxide film 8 shown in FIG. 1, insulating film 36 or any of first to third insulating films 46, 56, 66 shown in FIGS. 9 to 11 may be applied to the semiconductor device.

Third Embodiment

Figure 12:
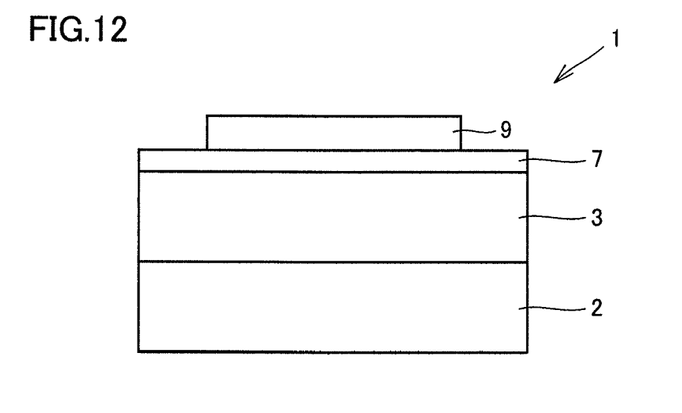
FIG. 12 is a schematic cross section showing a third embodiment of the semiconductor device according to the present invention.

Referring to FIG. 12, a third embodiment of the semiconductor device according to the present invention will be described.

With reference to FIG. 12, a semiconductor device 1 is a MOS capacitor, and includes a substrate 2 made of silicon carbide (SiC), an epitaxial layer 3 made of silicon carbide and formed on substrate 2, an oxide film 7 formed on a surface of epitaxial layer 3, and an electrode 9 formed on oxide film 7. On the back side of substrate 2 (the back side located opposite to the surface on which epitaxial layer 3 is formed), another electrode (not shown) may be formed. As oxide film 7, a silicon oxide film such as $SiO_2$ may be used. As a material for electrode 9, any conductive material may be used. For example, a metal such as aluminum may be used as a material for electrode 9. Such a MOS capacitor can be used to measure, by means of the high-low method for example, the interface state density in the vicinity of the interface between oxide film 7 and epitaxial layer 3.

Since semiconductor device 1 shown in FIG. 12 is manufactured using the manufacturing method of the present invention as described later herein, the interface state density in the vicinity of the interface between epitaxial layer 3 and oxide film 7 is sufficiently reduced. Instead of oxide film 7 in semiconductor device 1 shown in FIG. 12, insulating film 36 or any of first to third insulating films 46, 56, 66 shown in FIGS. 9 to 11 may be applied.

Figure 13:
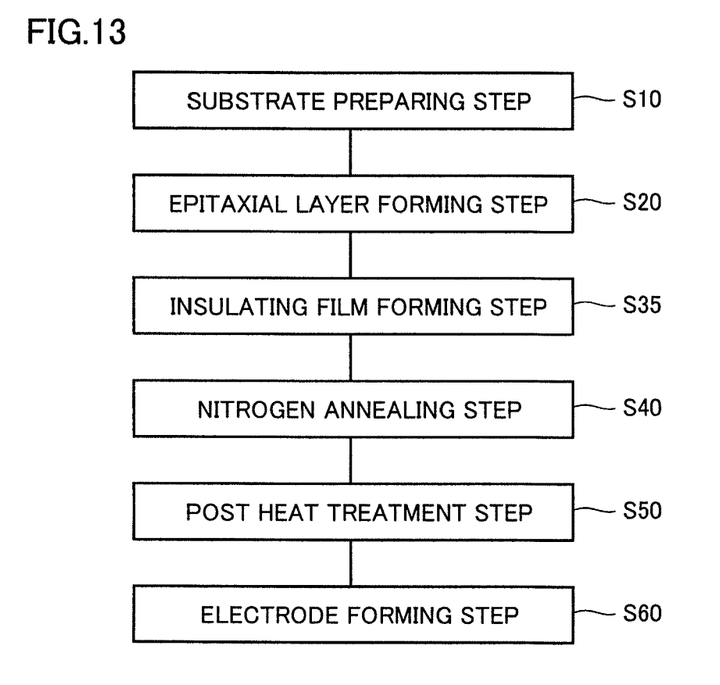
FIG. 13 is a flowchart for illustrating a method for manufacturing the semiconductor device shown in FIG. 12.

Referring next to FIG. 13, a method for manufacturing semiconductor device 1 shown in FIG. 12 will be described.

First, as shown in FIG. 13, a substrate preparing step (S10) is performed. In this step, a substrate made of silicon carbide and having any plane orientation is prepared, similarly to the substrate preparing step (S10) in FIG. 2.

Next, as shown in FIG. 13, an epitaxial layer forming step (S20) is performed. Specifically, undope silicon carbide epitaxial layer 3 (see FIG. 12) is formed on substrate 2.

Next, as shown in FIG. 13, an insulating film forming step (S35) is performed. Specifically, after the upper surface of epitaxial layer 3 is sacrificially oxidized, oxide film 7 (see FIG. 12) is formed. As a method for forming oxide film 7, thermal oxidation for example may be used. As the conditions for the thermal oxidation process, an oxidation temperature of not lower than 1100° C. and not higher than 1400° C. and an atmosphere such as an oxygen-containing atmosphere or a diluted oxygen atmosphere may be used for example. The time for which the thermal oxidation process is performed is determined as appropriate depending on the thickness of oxide film 7 to be formed. Before the insulating film forming step (S35) is performed, the upper surface of epitaxial layer 3 may be cleaned (a pre-oxidation cleaning step may be performed). As a cleaning method used for this cleaning, any conventionally well-known cleaning method may be used. Further, in the insulating film forming step (S35), any method for forming a film such as deposition method may be used. In the case where insulating film 36 or any of first to third insulating films 46, 56, 66 shown in FIGS. 9 to 11 is formed instead of oxide film 7, the method for forming a film described in connection with FIGS. 9 to 11 may be used.

Next, as shown in FIG. 13, a nitrogen annealing step (S40) is performed. Specifically, heat treatment is performed using nitrogen monoxide (NO) gas as an atmosphere gas. As the conditions for this heat treatment, the conditions that a heating temperature for example of not lower than 1100° C. and not higher than 1300° C. and heating time for example of approximately one hour may be used. As a result, nitrogen atoms can be introduced in an interface region between oxide film 7 and epitaxial layer 3.

Next, as shown in FIG. 13, a post heat treatment step (S50) is performed. Specifically, heat treatment is performed using an inert gas as an atmosphere gas. As an atmosphere gas, any inert gas may be used similarly to the post heat treatment step (S50) shown in FIG. 2. For example, argon (Ar) gas may be used as an atmosphere gas.

Here, the heat treatment temperature in the post heat treatment step (S50) is set higher than the heat treatment temperature in the nitrogen annealing step (S40). For example, in the case where the heat treatment temperature in the nitrogen annealing step (S40) is 1100° C., the heat treatment temperature in the post heat treatment step (S50) may be set at a temperature of higher than 1100° C. and not higher than 1500° C., more preferably not lower than 1200° C. and not higher than 1400° C.

Next, an electrode forming step (S60) is performed as shown in FIG. 13. Specifically, electrode 9 (see FIG. 12) is formed on oxide film 7. As a method for forming this electrode 9, the following method may be used. For example, a resist film having an opening pattern located in a region on oxide film 7 is formed in advance, and a conductive film which is to form electrode 9 is formed to cover the whole surface of the resist film. Then, the resist film is removed to thereby remove (lift off) the conductive film other than the portion of the conductive film which is to form electrode 9. Consequently, electrode 9 as shown in FIG. 12 is formed. In this way, the semiconductor device shown in FIG. 12 can be obtained.

Here, characteristic features of the present invention will be described one by one, including a part of the above-described features of the embodiments.

A method for manufacturing a silicon carbide semiconductor device according to the present invention includes the steps of:

preparing a semiconductor film (p-type layer 4 in FIG. 1, p region 23 in FIGS. 6 and 9 to 11, epitaxial layer 3 in FIGS. 12 and 15) made of silicon carbide (epitaxial layer forming step (S20));

forming oxide film 7, 8, or insulating film 36, or first to third insulating films 46, 56, 66, on a surface of the semiconductor film (gate insulating film forming step (S30) in FIG. 2 or insulating film forming step (S35) in FIG. 13);

performing heat treatment on the semiconductor film on which the oxide film or the insulating film is formed, in an atmosphere containing nitrogen (nitrogen annealing step (S40)); and performing, after the step of performing heat treatment, post heat treatment on the semiconductor film on which the oxide film is formed, in an atmosphere containing an inert gas (post heat treatment step (S50)). The heat treatment temperature (T2 in FIG. 3) in the step of performing post heat treatment (S50) is higher than the heat treatment temperature (T1 in FIG. 3) in the step of performing heat treatment (nitrogen annealing step (S40)) and lower than the melting point of oxide film 7, 8.

A method for manufacturing a silicon carbide semiconductor device according to the present invention includes the steps of:

preparing a semiconductor film (p-type layer 4 in FIG. 1, p region 23 in FIG. 6, epitaxial layer 3 in FIGS. 12 and 15) made of silicon carbide (epitaxial layer forming step (S20));

forming an insulating film (oxide film 7, 8, or insulating film 36, or first to third insulating films 46, 56, 66) on a surface of the semiconductor film (gate insulating film forming step (S30) in FIG. 2 or insulating film forming step (S35) in FIG. 13);

performing heat treatment on the semiconductor film on which the insulating film is formed, in an atmosphere containing nitrogen (nitrogen annealing step (S40)); and performing, after the step of performing heat treatment, post heat treatment on the semiconductor film on which the insulating film is formed (post heat treatment step (S50)). The heat treatment temperature (T2 in FIG. 3) in the step of performing post heat treatment (S50) is higher than the heat treatment temperature (T1 in FIG. 3) in the step of performing heat treatment and lower than a melting point of the insulating film.

Further, a method for manufacturing a silicon carbide semiconductor device according to the present invention includes the steps of:

preparing a semiconductor film (p-type layer 4 in FIG. 1, p region 23 in FIG. 6, epitaxial layer 3 in FIGS. 12 and 15) made of silicon carbide (epitaxial layer forming step (S20));

forming an insulating film (oxide film 7, 8 or insulating film 36 or first to third insulating films 46, 56, 66) on a surface of the semiconductor film by a deposition method (gate insulating film forming step (S30) in FIG. 2 or insulating film forming step (S35) in FIG. 13); and performing post heat treatment on the semiconductor film on which the insulating film is formed (post heat treatment step (S50)). The heat treatment temperature in the step of performing post heat treatment is higher than the process temperature in the step of forming an insulating film (S30) and lower than a melting point of the insulating film.

Regarding the above-described methods for manufacturing a silicon carbide semiconductor device, an atmosphere in which the post heat treatment step (S50) is carried out may be one of an inert gas atmosphere and an atmosphere containing at least one selected from the group consisting of hydrogen ($H_2$), water ($H_2O$), phosphorus oxychloride ($POCl_3$), nitrogen monoxide (NO), and dinitrogen monoxide ($N_2O$).

In this way, the interface state density in the interface between the semiconductor film (p-type layer 4 in FIG. 1, p region 23 in FIG. 6, epitaxial layer 3 in FIGS. 12 and 15) and oxide film 7, 8 or insulating film 36 or first insulating film 46 can be reduced, relative to the case where the heat treatment temperature in the post heat treatment step (S50) is equal to or lower than the heat treatment temperature in the nitrogen annealing step (S40) in the atmosphere containing nitrogen (nitrogen-containing atmosphere). Consequently, the carrier mobility in the semiconductor film can be enhanced, and accordingly a silicon carbide semiconductor device (semiconductor device 1) having excellent electrical characteristics including the carrier mobility can be obtained.

Regarding the above-described methods for manufacturing a silicon carbide semiconductor device, the heat treatment temperature in the post heat treatment step (S50) may be a temperature of not lower than 1100° C. and not higher than 1500° C. Further, oxide film 7, 8 or insulating film 36 or first insulating film 46 may preferably be a silicon oxide film. In this case, the effect of reducing the interface state density can further be ensured. The lower limit of the heat treatment temperature (heat treatment temperature for the second heat treatment) in the post heat treatment step (S50) is set at 1100° C. for the following reason. The heat treatment temperature for the second heat treatment can be set at this temperature or higher to sufficiently promote termination of dangling bonds by nitrogen introduced in the interface by the first heat treatment in the nitrogen annealing step (S40), and/or promote diffusion, from the interface, of atoms (carbon atoms for example) due to which the dangling bonds are generated in the interface region. Further, the upper limit of the heat treatment temperature (temperature T2 in FIG. 3) for the second heat treatment is set at 1500° C., since a temperature of 1500° C. or lower can suppress softening of a common oxide film, and accordingly avoid occurrence of problems such as breakage of semiconductor device 1. In the case where a silicon oxide film is used as oxide film 7, 8, the softening point of the silicon oxide film is approximately 1500° C.

Figure 16:
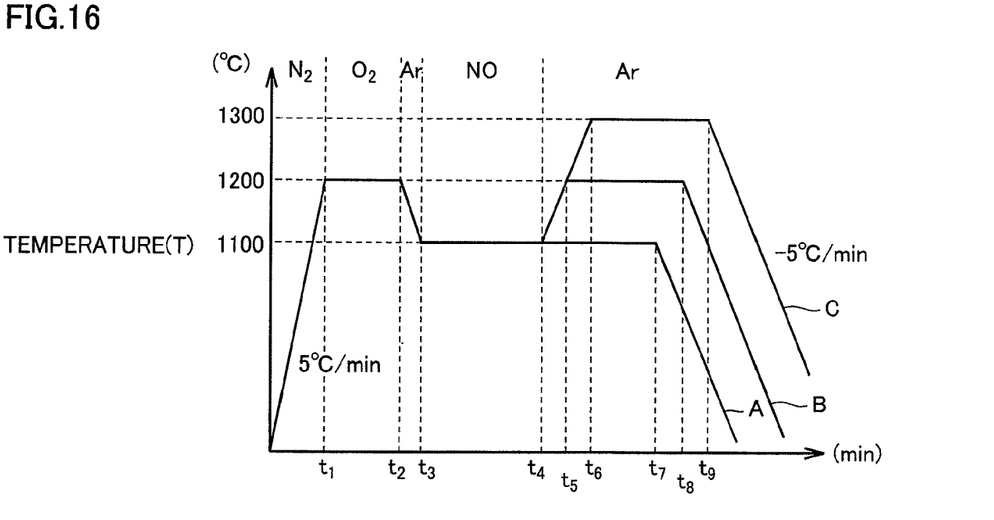
FIG. 16 is a graph showing a heat pattern for heat treatment in a method for manufacturing a sample.

Regarding the above-described methods for manufacturing a silicon carbide semiconductor device, the insulating film forming step (S30), the nitrogen annealing step (S40), and the post heat treatment step (S50) may be carried out continuously without interruption between the steps as shown for example in FIG. 16. The gate insulating film forming step (S30) and the post heat treatment step (S50) may also be performed continuously without interruption therebetween. Here, after the nitrogen annealing step (S40) is performed, if the temperature of the semiconductor film and the insulating film (oxide film 7, 8 or insulating film 36 or first to third insulating films 46, 56, 66) is temporarily decreased and then the semiconductor film and the insulating film are heated for performing the post heat treatment step (S50), a defect such as crack could be caused in the insulating film due to thermal shock. In view of this, the nitrogen annealing step (S40) and the post heat treatment step (S50) can be performed without interruption therebetween as described above to suppress occurrence of such thermal shock. Accordingly, occurrence of defect such as occurrence of crack in the insulating film (oxide film 7, 8 or insulating film 36 or first to third insulating films 46, 56, 66) can be suppressed.

Regarding the above-described methods for manufacturing a silicon carbide semiconductor device, in the step of forming an oxide film or forming an insulating film (oxide film 7, 8 or insulating film 36 or first to third insulating films 46, 56, 66) (gate insulating film forming step (S30)), the oxide film may be formed by the thermal oxidation method. In this case, an oxide film having an excellent film quality as the quality of a gate insulating film can be formed.

Regarding the above-described methods for manufacturing a silicon carbide semiconductor device, the step of forming an oxide film or the step of forming an insulating film (gate insulating film forming step (S30)) may include the step of forming, by the deposition method, a film that is to form the oxide film or insulating film (oxide film 7, 8 or insulating film 36 or first to third insulating films 46, 56, 66), on the surface of the semiconductor film. The film that is to form the gate insulating film can be formed by this deposition method to expand the freedom of choice of the material for the gate insulating film.

The above-described methods for manufacturing a silicon carbide semiconductor device may further include the step of heating, in an oxygen-containing atmosphere, the semiconductor film on which the film that is to form the oxide film or the insulating film is formed. The step of heating is performed after the step of forming, by a deposition method, a film that is to form the oxide film or insulating film (oxide film 7, 8 or insulating film 36 or first to third insulating films 46, 56, 66) (gate insulating film forming step (S30)) and before the step of performing post heat treatment (post heat treatment step (S50)). Consequently, regarding the semiconductor film of silicon carbide on which the oxide film is formed, the front side on which the film that is to form the oxide film or insulating film is formed can be oxidized. Accordingly, the oxygen-containing atmosphere diffuses in the deposited insulating film (deposited oxide film for example) to reach the surface of silicon carbide, and thereby oxidize the silicon carbide surface. Thus, the interface of higher quality between the insulating film (deposited oxide film) and silicon carbide can be obtained. Further, a nitrogen-containing atmosphere (NO or $N_2O$ for example) or a hydrogen-containing atmosphere can be used to introduce nitrogen or hydrogen in the interface between the deposited insulating film (deposited oxide film for example) and silicon carbide, and thus the effect of terminating dangling bonds can be expected. These effects enable reduction of the interface state density.

The above-described methods for manufacturing a silicon carbide semiconductor device may further include the step of forming an upper insulating film (second insulating film 56 and third insulating film 66) on the oxide film or insulating film (oxide film 7, 8 or insulating film 36 or first insulating film 46). From the silicon carbide semiconductor device configured as described above, the above-described effects of the present invention can also be obtained.

The silicon carbide semiconductor devices (semiconductor devices 1 shown in FIGS. 1, 6, 9 to 12, 15) according to the present invention are manufactured by the above-described methods for manufacturing a silicon carbide semiconductor device. Semiconductor device 1 thus obtained has a reduced interface state density in the vicinity of the interface between the semiconductor film (p-type layer 4 in FIG. 1, p region 23 in FIGS. 6 and 9 to 11, epitaxial layer 3 in FIGS. 12 and 15) and the insulating film (oxide film 7, 8 or insulating film 36 or first insulating film 46). Therefore, a higher channel mobility than the conventional one can be achieved in the interface between the semiconductor and the insulating film (oxide film for example). Accordingly, in semiconductor device 1 using, as a gate insulating film, the above-described oxide film 7, 8 or insulating film 36 or first to third insulating films 46, 56, 66, the ratio of the channel resistance component to the device's ON resistance can be reduced. Consequently, semiconductor device 1 of high breakdown voltage and low loss can be implemented. Here, an oxynitride layer may be used as an oxide film.

EXAMPLES

In order to confirm the effects of the present invention, the following experiment was conducted.

Preparation of Sample

Figure 14:
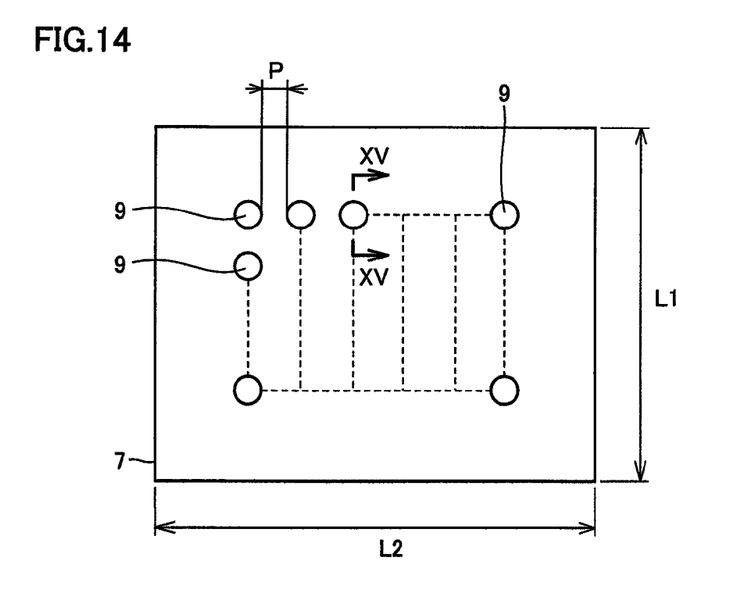
FIG. 14 is a schematic plan view of a sample prepared for an experiment.
Figure 15:
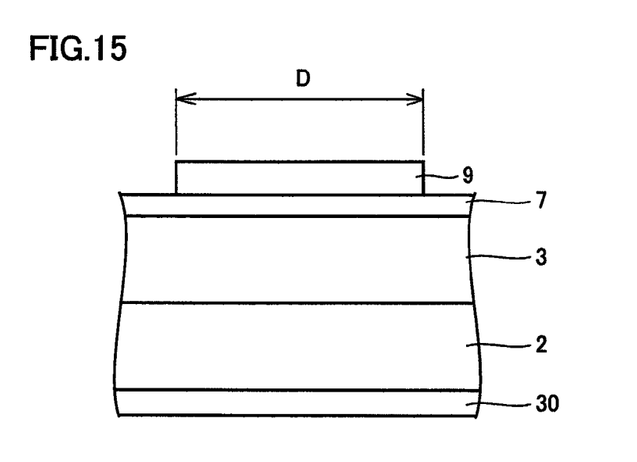
FIG. 15 is a schematic cross section along a line XV-XV in FIG. 14.

Shape of Sample:

Referring to FIGS. 14 and 15, a prepared sample will be described.

Referring to FIG. 14, the two-dimensional shape of the sample was a rectangular shape having a vertical length L1 and a lateral length L2 that were both set to 15 mm to 20 mm. Further, as shown in FIG. 14, the cross-sectional structure of the sample is basically similar to that of the semiconductor device shown in FIG. 12. Specifically, a silicon carbide substrate having the n-type conductivity and a main surface whose plane orientation was the {03-38} plane was used as substrate 2 and, on the main surface of substrate 2, epitaxial layer 3 made of silicon carbide and having the n-type conductivity was formed. The thickness of substrate 2 was set to 400 μm and the concentration of the dopant having the n-type conductivity was $1\times10^{19}$ cm$^{-3}$. As a dopant, nitrogen (N) was used. The thickness of epitaxial layer 3 was set to 10 μm. As a dopant in epitaxial layer 3, nitrogen was used. The concentration of this dopant was $1\times10^{16}$ cm$^{-3}$.

On epitaxial layer 3, a silicon oxide film ($SiO_2$) was formed as oxide film 7. The thickness of oxide film 7 was 45 nm to 50 nm. On oxide film 7, a plurality of electrodes 9 were arranged in the form of a matrix as shown in FIG. 14. The two-dimensional shape of electrode 9 was a circular shape, the diameter of electrode 9 was 400 μm, and a distance P between electrodes 9 adjacent to each other was set to 300 μm. Further, as a material for electrode 9, aluminum (Al) was used. The thickness of electrode 9 was set to 300 nm. On the back side of substrate 2, a silver paste 30 was disposed as an electrode.

Method for Manufacturing Sample:

The sample was prepared by a method basically similar to the method for manufacturing the semiconductor device shown in FIG. 13. As to the sample, under three different experimental conditions described later herein, two samples were prepared for each experimental condition (namely total six samples). Specifically, in the substrate preparing step (S10), a silicon carbide substrate whose main surface was a {03-38} plane was prepared. In the epitaxial layer forming step (S20), the epitaxial growth method was used to form epitaxial layer 3 made of silicon carbide and containing nitrogen as a dopant. Then, in the insulating film forming step (S35), the surface of epitaxial layer 3 was cleaned (pre-oxidation cleaning) and thereafter a heat treatment process was performed. The heat treatment process was performed under the conditions as shown in FIG. 16 that the heating temperature was 1200° C. and the heat treatment time (from time t1 to time t2 in FIG. 16) was 50 minutes. Here, the horizontal axis in FIG. 16 represents the time (t) (in minutes) and the vertical axis represents the temperature (T) (heating temperature in °C.). As seen from FIG. 16, until the heating temperature in the heat treatment process is reached, it was heated at a rate of temperature increase of 5° C./min (here, the rate of temperature increase may further be decreased). In an upper row of FIG. 16, the type of the atmosphere gas in each time zone is indicated. For example, the atmosphere gas for the heat treatment up to time t1 is nitrogen gas ($N_2$ gas), the atmosphere gas for the heat treatment from time t1 to time t2 is oxygen gas ($O_2$ gas), and the atmosphere gas from time t2 to time t3 is argon gas (Ar gas). Further, the atmosphere gas for the heat treatment from time t3 to time t4 is nitrogen monoxide gas (NO gas), and the atmosphere gas for the heat treatment after time t4 is argon gas.

Next, in the nitrogen annealing step (S40), nitrogen monoxide (NO) gas was used as an atmosphere gas immediately after the above-described heat treatment process, and heat treatment was performed at a heat treatment temperature of 1100° C. for heating time (the time from time t3 to time t4 in FIG. 16) of 120 minutes.

In the steps up to and including the above-described nitrogen annealing step (S40), the conditions common to all samples were used. In contrast, in the post heat treatment step (S50) described below, samples were produced under three different conditions (condition A to condition C). For each condition, two samples were processed.

First, under Condition A (Comparative Example), the post heat treatment step (S50) was performed in which heat treatment was conducted using argon gas as an atmosphere gas, at a heat treatment temperature of 1100° C. (a heat treatment temperature similar to that in the nitrogen annealing step (S40)) as shown by graph A in FIG. 16. The heat treatment time (from time t4 to time t7 in FIG. 16) at this time was set to 60 minutes.

Further, under Condition B (Example 1), the post heat treatment step (S50) was performed in which heat treatment was conducted using argon gas as an atmosphere gas, at a heat treatment temperature of 1200° C. (a temperature higher than the heat treatment temperature in the nitrogen annealing step (S40)) as shown by graph B in FIG. 16. The heat treatment time (from time t5 to time t8 in FIG. 16) at this time was set to 60 minutes.

Further, under Condition C (Example 2), the post heat treatment step (S50) was performed in which heat treatment was conducted using argon gas as an atmosphere gas, at a heat treatment temperature of 1300° C. (a temperature higher than the heat treatment temperature in the nitrogen annealing step (S40)) as shown by graph C in FIG. 16. The heat treatment time (from time t6 to time t9 in FIG. 16) at this time was set to 60 minutes. After this, each sample was cooled at a temperature decrease rate of 5° C. per minute.

Next, on all samples, the electrode forming step (S60) was performed. Specifically, the lift-off method was used to form, on oxide film 7, a plurality of electrodes 9 made of aluminum. On the back side of substrate 2, silver paste 30 was disposed as shown in FIG. 15. In this way, the sample (MOS capacitor) shown in FIGS. 14 and 15 was obtained.

Method for Experiment

For each sample, the interface state in the interface (MOS interface) between epitaxial layer 3 and oxide film 7 was evaluated. Specifically, the capacitance-voltage characteristics (CV characteristics) were measured. For high-frequency CV measurement, the measurement frequency was set to 1 MHz. Low-frequency CV measurement was performed by means of the quasi-static CV measurement method. A capacitance Cs of a depletion layer formed on the semiconductor side (epitaxial layer 3 side) of the MOS interface was determined by solving the Poisson's equation. At this time, consideration was not given to the state of inversion, and it was supposed that the depletion layer had a deep depletion state.

Further, for the above-described samples in the examples and the comparative example, the interface state density was calculated using the high-low method similar to the method disclosed in PTL 1.

Results

Figure 17:
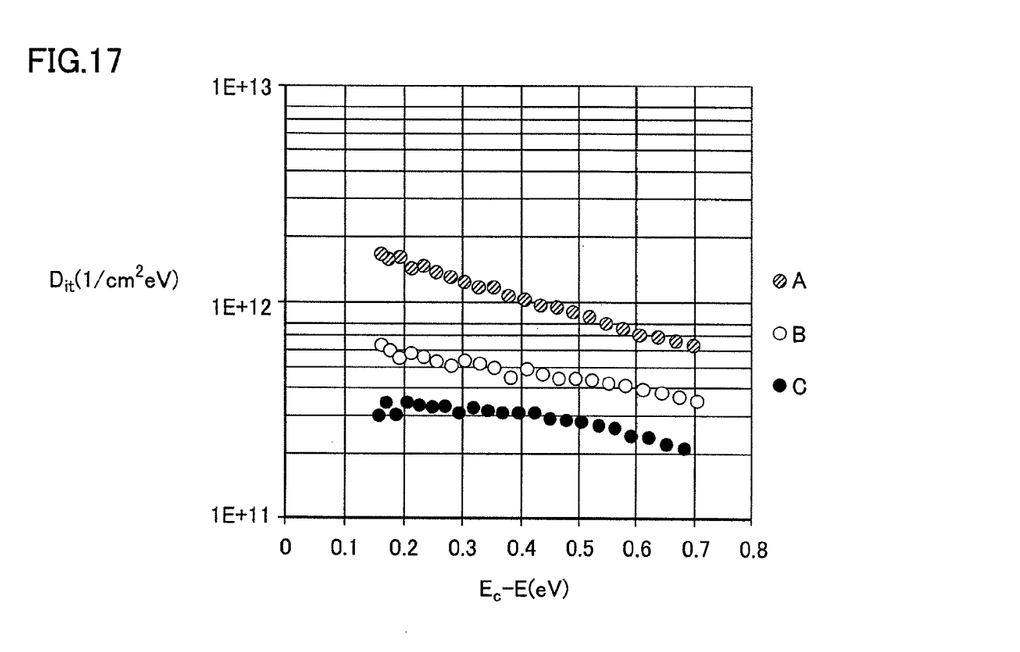
FIG. 17 is a graph showing a relation between the interface state density and the energy relative to the conduction band.

Referring to FIG. 17, the results of the above-described experiment will be described.

In FIG. 17, the vertical axis represents the interface state density Dit (in $cm^{-2} eV^{-1}$), and the horizontal axis represents the value of the energy (Ec-E (in eV)) relative to the conduction band. The results are indicated for each of Condition A, Condition B, and Condition C in the post heat treatment step (S50) described above.

As seen from FIG. 17, the interface state density under Conditions B and C (Examples 1 and 2), under which the heat treatment temperature in the post heat treatment step (S50) is higher than the heat treatment temperature in the nitrogen annealing step (S40), is lower than that under Condition A (Comparative Example), under which the heat treatment temperature in the post heat treatment step (S50) and the heat treatment temperature in the nitrogen annealing step (S40) are equal to each other. From a comparison between Condition B and Condition C, it is also seen that the interface state density is lower as the heat treatment temperature in the post heat treatment step (S50) is higher. In the samples of the Examples, the interface state density is less than $1 \times 10^{12}$ ($cm^{-2} eV^{-1}$) in almost all energy regions.

It should be construed that the embodiments and examples disclosed herein are by way of illustration in all respects, not by way of limitation. It is intended that the scope of the present invention is defined by claims, not by the above description and encompasses all modifications and variations equivalent in meaning and scope to the claims.

Industrial Applicability

The present invention is advantageously applied to silicon carbide semiconductor devices such as MOSFET and DiMOSFET formed in such a manner that an insulating film contacts a semiconductor layer made of silicon carbide.

Reference Signs List 1 semiconductor device; 2 substrate; 3 epitaxial layer; 4 p-type layer; 5, 6, 24 n$^+$ region; 7, 8, 26 oxide film; 9 electrode; 10 gate electrode; 11 source electrode; 12 drain electrode; 15 opening; 21 buffer layer; 22 breakdown voltage holding layer; 23 p region; 25 p$^+$ region; 27 upper source electrode; 30 silver paste; 36 insulating film; 46 first insulating film; 56 second insulating film; 66 third insulating film

The invention claimed is:

1. A method for manufacturing a silicon carbide semiconductor device, comprising the steps of:
   preparing a semiconductor film made of silicon carbide;
   forming an oxide film on a surface of said semiconductor film;
   performing heat treatment on said semiconductor film on which said oxide film is formed, in an atmosphere containing nitrogen; and
   performing, after said step of performing heat treatment, post heat treatment on said semiconductor film on which said oxide film is formed, in an atmosphere containing an inert gas,
   a heat treatment temperature in said step of performing post heat treatment being higher than a heat treatment temperature in said step of performing heat treatment and lower than a melting point of said oxide film, and not lower than 1200° C. and not higher than 1400° C., and
   said heat temperature in said step of performing heat treatment is not lower than 1100° C. and not higher than 1300° C.

2. The method for manufacturing a silicon carbide semiconductor device according to claim 1, wherein said step of performing heat treatment and said step of performing post heat treatment are carried out without interruption between these steps.

3. The method for manufacturing a silicon carbide semiconductor device according to claim 1, wherein in said step of forming an oxide film, said oxide film is formed by thermal oxidation method.

4. The method for manufacturing a silicon carbide semiconductor device according to claim 1, wherein said step of forming an oxide film includes the step of forming, by a deposition method, a film that is to form said oxide film, on the surface of said semiconductor film.

5. The method for manufacturing a silicon carbide semiconductor device according to claim 4, further comprising the step of heating, in an oxygen-containing atmosphere, said semiconductor film on which said film that is to form said oxide film is formed, said step of heating being performed after said step of forming, by a deposition method, a film that is to form said oxide film and before said step of performing post heat treatment.

6. The method for manufacturing a silicon carbide semiconductor device according to claim 1, further comprising the step of forming an upper insulating film on said oxide film.

7. A silicon carbide semiconductor device manufactured using the method for manufacturing a silicon carbide semiconductor device as recited in claim 1.

8. A method for manufacturing a silicon carbide semiconductor device, comprising the steps of:
   preparing a semiconductor film made of silicon carbide;
   forming an insulating film on a surface of said semiconductor film;
   performing heat treatment on said semiconductor film on which said insulating film is formed, in an atmosphere containing nitrogen; and
   performing, after said step of performing heat treatment, post heat treatment on said semiconductor film on which said insulating film is formed,
   a heat treatment temperature in said step of performing post heat treatment being higher than a heat treatment temperature in said step of performing heat treatment and lower than a melting point of said insulating film, and not lower than 1200° C. and not higher than 1400° C., and said heat temperature in said step of performing heat treatment is not lower than 1100° C. and not higher than 1300° C.

9. The method for manufacturing a silicon carbide semiconductor device according to claim 8, wherein an atmosphere in which said step of performing post heat treatment is carried out is one of an inert gas atmosphere and an atmosphere containing at least one of hydrogen, water, phosphorus oxychloride, nitrogen monoxide or dinitrogen monoxide.

10. The method for manufacturing a silicon carbide semiconductor device according to claim 8, wherein the steps from said step of forming an insulating film to and including said step of performing post heat treatment are carried out without interruption between these steps.

11. The method for manufacturing a silicon carbide semiconductor device according to claim 8, wherein in said step of forming an insulating film, said insulating film is formed by thermal oxidation method.

12. The method for manufacturing a silicon carbide semiconductor device according to claim 8, wherein said step of forming an insulating film on a surface of said semiconductor film includes the step of forming, by a deposition method, a film that is to form the insulating film, on the surface of said semiconductor film.

13. The method for manufacturing a silicon carbide semiconductor device according to claim 12, further comprising the step of heating, in an oxygen-containing atmosphere, said semiconductor film on which the film that is to form said insulating film is formed, said step of heating being performed after said step of forming, by a deposition method, a film that is to form the insulating film and before said step of performing post heat treatment.

14. The method for manufacturing a silicon carbide semiconductor device according to claim 8, further comprising the step of forming an upper insulating film on said insulating film.

15. A silicon carbide semiconductor device manufactured using the method for manufacturing a silicon carbide semiconductor device as recited in claim 8.

16. The method for manufacturing a silicon carbide semiconductor device according to claim 2, wherein said step of performing heat treatment and said step of performing post heat treatment are carried out without interruption between these steps such that a temperature of said semiconductor film and said oxide film is prevented from temporarily decreasing between these steps.

17. The method for manufacturing a silicon carbide semiconductor device according to claim 10, wherein the steps from said step of forming an insulating film to and including said step of performing post heat treatment are carried out without interruption between the steps such that a temperature of said semiconductor film and said insulating film is prevented from temporarily decreasing between the steps.

\* \* \* \* \*